United States Patent
Yang et al.

(10) Patent No.: US 10,921,719 B2
(45) Date of Patent: Feb. 16, 2021

(54) OPTICAL MEASUREMENT DEVICE AND METHOD

(71) Applicant: SHANGHAI MICRO ELECTRONICS EQUIPMENT (GROUP) CO., LTD., Shanghai (CN)

(72) Inventors: Zhiyong Yang, Shanghai (CN); Bing Xu, Shanghai (CN); Yuzhi Li, Shanghai (CN); Chang Zhou, Shanghai (CN)

(73) Assignee: Shanghai Micro Electronics Equipment (Group) Co., Ltd., Shanghai (CN)

(*) Notice: Subject to any disclaimer, the term of this patent is extended or adjusted under 35 U.S.C. 154(b) by 0 days.

(21) Appl. No.: 16/338,669

(22) PCT Filed: Sep. 25, 2017

(86) PCT No.: PCT/CN2017/103233
§ 371 (c)(1),
(2) Date: Apr. 1, 2019

(87) PCT Pub. No.: WO2018/059359
PCT Pub. Date: Apr. 5, 2018

(65) Prior Publication Data
US 2019/0235396 A1    Aug. 1, 2019

(30) Foreign Application Priority Data
Sep. 30, 2016 (CN) .......................... 2016 1 0876758

(51) Int. Cl.
*G03F 7/20* (2006.01)
*G01B 9/02* (2006.01)
(Continued)

(52) U.S. Cl.
CPC ...... *G03F 7/70775* (2013.01); *G01B 9/02019* (2013.01); *G01B 11/06* (2013.01);
(Continued)

(58) Field of Classification Search
CPC .... G03F 7/70775; G03F 7/20; G03F 7/70783; G03F 9/70; G03F 7/70616; G01B 11/06; G01B 9/02019; G01B 11/161
See application file for complete search history.

(56) References Cited

U.S. PATENT DOCUMENTS

2008/0246936 A1* 10/2008 Loopstra ............. G03F 7/70725
355/53
2012/0050709 A1* 3/2012 Van Der Pasch ... G03F 7/70775
355/67
(Continued)

FOREIGN PATENT DOCUMENTS

CN     101405837 A    4/2009
CN     101320223 B    3/2011
(Continued)

*Primary Examiner* — Dominic J Bologna
(74) *Attorney, Agent, or Firm* — Muncy, Geissler, Olds & Lowe, P.C.

(57) ABSTRACT

An optical measurement device includes: a deformation measurement device for measuring magnitude of deformation of an optical detection platform frame, and a correction module for correcting the position of a substrate carrier and/or the position of an optical detection device according to the magnitude of deformation of the optical detection platform frame, so as to eliminate an error in measurement of mark positions due to deformation of the frame. An optical measurement method is also disclosed.

15 Claims, 1 Drawing Sheet

(51) Int. Cl.
  *G01B 11/06*  (2006.01)
  *G03F 9/00*  (2006.01)
  *G01B 11/16*  (2006.01)

(52) U.S. Cl.
  CPC ............ *G03F 7/20* (2013.01); *G03F 7/70783* (2013.01); *G01B 11/161* (2013.01); *G03F 9/70* (2013.01)

(56) References Cited

U.S. PATENT DOCUMENTS

| | | | |
|---|---|---|---|
| 2012/0147352 A1* | 6/2012 | Ito | ............................ G01B 9/02 355/72 |
| 2014/0322833 A1 | 10/2014 | Yamaguchi et al. | |
| 2015/0219450 A1* | 8/2015 | Hohshi | .................. G01B 15/02 378/50 |

FOREIGN PATENT DOCUMENTS

| | | | |
|---|---|---|---|
| CN | 102385255 | A | 3/2012 |
| CN | 104412062 | A | 3/2015 |
| CN | 105182695 | A | 12/2015 |
| CN | 105527796 | A | 4/2016 |
| CN | 105917441 | A | 8/2016 |
| JP | 2004-111653 | A | 4/2004 |
| JP | 2005-300640 | A | 10/2005 |
| JP | 3984841 | B2 | 7/2007 |
| JP | 2012127995 | A | 7/2012 |
| JP | 2012129311 | A | 7/2012 |
| JP | 2016133349 | A | 7/2016 |
| TW | M360360 | U1 | 7/2009 |

\* cited by examiner

OPTICAL MEASUREMENT DEVICE AND METHOD

TECHNICAL FIELD

The present invention relates to the field of semiconductors, and in particular, to an optical measurement device and method.

BACKGROUND

During manufacturing of a semiconductor integrated circuit, a complete chip usually needs to be subjected to photolithography and exposure for many times before fabrication is completed. Photolithography is a process of forming a line on a photoresist-coated substrate by means of exposure and development. A process of performing a further photolithography on the substrate having being subjected to photolithography is called overlay. During photolithography, factors that affect photolithography accuracy mainly include: a positional deviation between the substrate and a mask, a line width of a line formed by photolithography, the thickness of the photoresist, and an overlay deviation.

Among commercially-available optical measurement apparatuses at present, there is one that integrates measurement of a film thickness, position, and overlay deviation. For example, Chinese patent publication No. CN104412062A (application No. CN201380035853.2, and publication date: Mar. 11, 2015) provides a film thickness measurement device, where a to-be-measured substrate is placed on a substrate carrier above which there is a gantry, and a film thickness measurer is mounted on a slider and moves on the gantry, to measure the thickness of a film on the substrate. The device also includes a position adjustment unit, which is a unit for measuring the position and an overlay deviation. Currently, the unit for measuring the position and the overlay deviation is a bridge-like or of a gantry structure. A measurement interferometer is disposed in each moving direction of the unit for measurement control, while no measurement interferometer is disposed in a non-moving direction. Position correction is implemented by using a large mask covering the whole measurement range.

The current measurement apparatus that integrates measurement of the film thickness, position, and overlay deviation has the following problems:

1. For a bridge-like structure, a bridge-like frame may deform as the substrate carrier moves, and magnitude of deformation varies at different positions to which the substrate carrier moves, thus affecting position variation of a measurement system on the bridge-like structure.

2. When performing test on substrates, the substrates having being subjected to development are delivered through a production line to the measurement apparatus. Because the temperature in the factory is controlled at 23±1 degrees, the substrates need to be put aside for a long time before test, till the temperature of the substrates reach the target temperature of 23±0.1 degrees, which prolongs the process time and reduces production efficiency.

SUMMARY OF THE INVENTION

The present invention provides an optical measurement device and method. A deformation measurement device for measuring magnitude of deformation of an optical detection platform frame, and a correction module for correcting the position of a substrate carrier according to the magnitude of deformation of the optical detection platform frame are disposed, so as to solve the foregoing problem.

To achieve the foregoing objective, the present invention provides an optical measurement device, which includes: a substrate carrier, configured to carry a substrate; an optical detection platform frame, configured to bear and support an optical detection slider above the substrate carrier, the optical detection slider being able to slide along the optical detection platform frame; an optical detection device, attached to the optical detection slider, and able to move along the optical detection platform frame with the optical detection slider; a first position measurement device, configured to measure a position of the substrate carrier; and a second position measurement device, configured to measure a position of the optical detection device, wherein the optical measurement device further includes: a deformation measurement device for measuring a magnitude of deformation of the optical detection platform frame, and a correction module for correcting the position of the substrate carrier and/or the position of the optical detection device according to the magnitude of deformation of the optical detection platform frame.

Preferably, the optical detection platform frame is of a bridge type and includes two support uprights and a beam fixed on the two support uprights; and the optical detection slider is able to slide on the beam.

Preferably, the deformation measurement device includes two first interferometer measuring components arranged in parallel with a slide direction of the optical detection slider; and the two first interferometer measuring components are in one-to-one correspondence with the two support uprights and emit measurement light beams onto the two support uprights.

Preferably, the first position measurement device includes two second interferometer measuring components, which are parallel with and perpendicular to the slide direction of the optical detection slider, respectively; and the two second interferometer measuring components emit measurement light beams onto the substrate carrier.

Preferably, the two first interferometer measuring components and the two second interferometer measuring components are arranged at a same level.

Preferably, at least one of the two first interferometer measuring components is a biaxial interferometer, and two measurement light beams emitted by the biaxial interferometer are parallelly distributed along an extension direction of the two support uprights.

Preferably, the deformation measurement device also includes a third interferometer measuring component perpendicular to each of the slide direction of the optical detection slider and an extension direction of the two support uprights, and the third interferometer measuring component emits a measurement light beam onto the optical detection platform frame along the slide direction of the optical detection slider.

Preferably, the third interferometer measuring component is a monoaxial interferometer.

Preferably, the third interferometer measuring component is a biaxial interferometer.

Preferably, the optical measurement device further includes a height adjustment device for measuring and adjusting a distance from the optical detection device to an upper surface of the substrate.

Preferably, the optical measurement device further includes a support base for carrying the substrate carrier and the optical detection platform frame.

Preferably, the support base includes a vibration damper and a marble platform from bottom to top.

Preferably, the optical detection device is used for detecting one or more of a line width of a pattern formed on the substrate after exposure, an overlay deviation, a mark position deviation, and a photoresist thickness.

The present invention also provides an optical measurement method, where a direction in which an optical detection slider moves along an optical detection platform frame is defined as an X direction, a direction perpendicular to the X direction within a horizontal plane is defined as a Y direction, and a vertical direction is defined as a Z direction, to establish a three-dimensional coordinate system in the X, Y, Z directions; and the method specifically includes the following steps:

providing a substrate having detection marks and placing the substrate on a substrate carrier;

controlling the substrate carrier to move along the Y direction by a distance of Yi, and controlling an optical detection device to move along the X direction by a distance of Xi, such that a detection mark i is located below the optical detection device; and measuring, by a deformation measurement device, a magnitude of deformation of the optical detection platform frame; and correcting, by a correction module, a position of the substrate carrier and/or a position of the optical detection device according to the magnitude of deformation of the optical detection platform frame, and calculating a position of the detection mark i according to the corrected position of the substrate carrier and/or the corrected position of the optical detection device, such that the optical detection device is aligned with the detection mark i.

Preferably, correcting, by the correction module, the position of the substrate carrier according to the magnitude of deformation of the optical detection platform frame includes:

emitting at least two first measurement light beams parallel with the Y direction onto two support uprights of the optical detection platform frame; when the substrate carrier moves in the Y direction, measuring magnitudes Y1_ref and Y2_ref of deformations of the two support uprights in the Y direction, to obtain a magnitude Yi_ref of deformation of the optical detection platform frame in the Y direction as Yi_ref=(Y1_ref+Y2_ref)/2 and a magnitude Rzi_ref of rotational deformation of the substrate carrier about a Z axis as Rzi_ref=(Y1_ref−Y2_ref)/IFdx_ref, wherein IFdx_ref is a distance between the two first measurement light beams in the X direction;

calculating a correction Delt_Yi for the position of the substrate carrier as Delt_Yi=−(Yi_ref+Rzi_ref*Xi); and feeding back the correction Delt_Yi to the correction module, so that the correction module corrects the position of the substrate carrier in the Y direction.

Preferably, correcting, by the correction module, the position of the optical detection device according to the magnitude of deformation of the optical detection platform frame includes:

emitting a second measurement light beam parallel with the X direction onto the optical detection platform frame; and when the optical detection device moves along the X direction, measuring a magnitude Xi_ref of deformation of the optical detection platform frame in the X direction and a magnitude Ryi_ref of inclined deformation thereof about a Y axis;

simultaneously emitting two third measurement light beams parallel with the Y direction onto the optical detection platform frame; and measuring a magnitude Rxi_ref of inclined deformation of the optical detection platform frame about an X axis, wherein the two third measurement light beams are parallel along the Z direction; and correcting, by the correction module, the position of the optical detection device in the X direction according to the magnitude Xi_ref of deformation of the optical detection platform frame in the X direction, the magnitude Ryi_ref of inclined deformation about the Y axis, and the magnitude Rxi_ref of inclined deformation about the X axis.

Compared with the prior art, the present invention has the following beneficial effects:

The present invention provides an optical measurement device and method. A deformation measurement device for measuring magnitude of deformation of an optical detection platform frame, and a correction module for correcting the position of a substrate carrier and/or the position of the optical detection device according to the magnitude of deformation of the optical detection platform frame are disposed, so as to eliminate an error in measurement of mark positions due to deformation of the frame.

DESCRIPTION OF REFERENCE NUMERALS IN THE DRAWINGS

1—Support base; 2—Optical detection platform frame; 21, 22—Frame Y-direction interferometer measurement systems; 3—Optical detection slider; 4—Vertical motion mechanism control unit; 5—Optical detection module; 51—Module X-direction interferometer control and measurement system; 52—Slider X-direction interferometer control and measurement system; 53—Module Y-direction interferometer control and measurement system; 5a—Rough position measurement sensor; 5b—First sensor for precise position and line width measurement; 5c—Second sensor for precise position and line width measurement; 5d—Photoresist thickness measurement sensor; 5e—First height measurement sensor; 5f—Second height measurement sensor; 6—Substrate carrier; 61—X-direction interferometer control and measurement system for the substrate carrier; 62—Y-direction interferometer control and measurement system for the substrate carrier; 7—Reference board; 71—Line width calibration reference board; 72—X-direction reference board; 73—Y-direction reference board; 74—Photoresist thickness calibration reference board; 8—Substrate temperature control unit; 9—Substrate; 91—Substrate mark.

DETAILED DESCRIPTION

To make the objective, features, and advantages of the present invention clearer, specific embodiments of the present invention are described in detail below with reference to the accompanying drawings.

Embodiment 1

Figure 1:
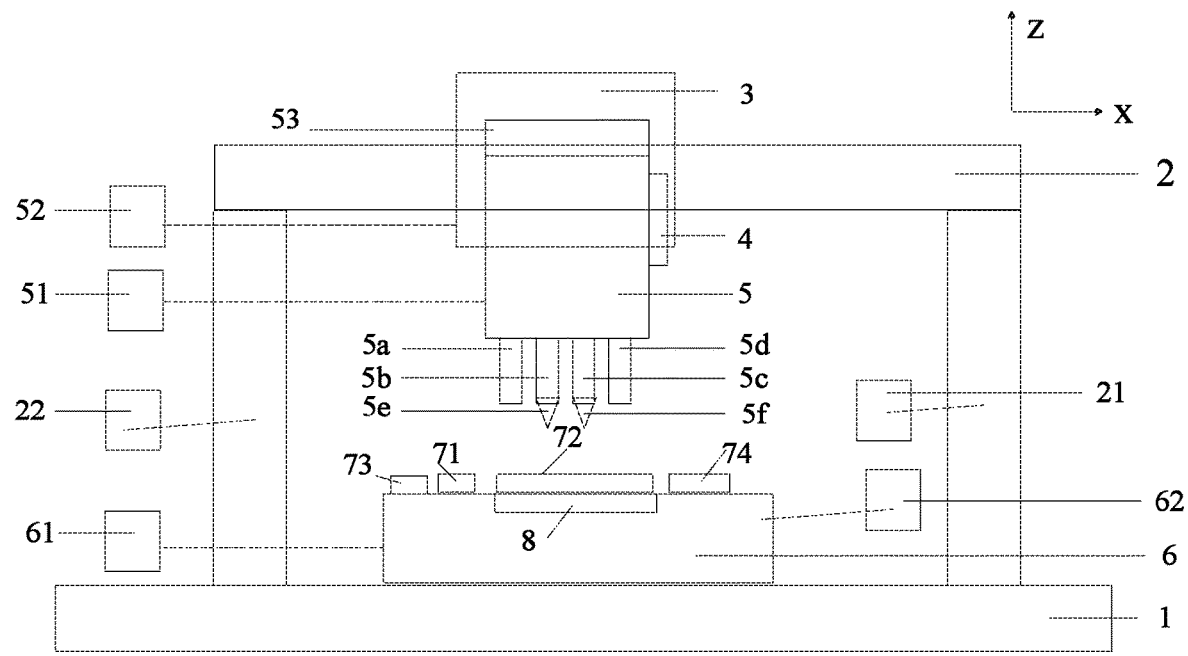
FIG. 1 is a schematic structural diagram of a measurement device provided by the present invention.
Figure 2:
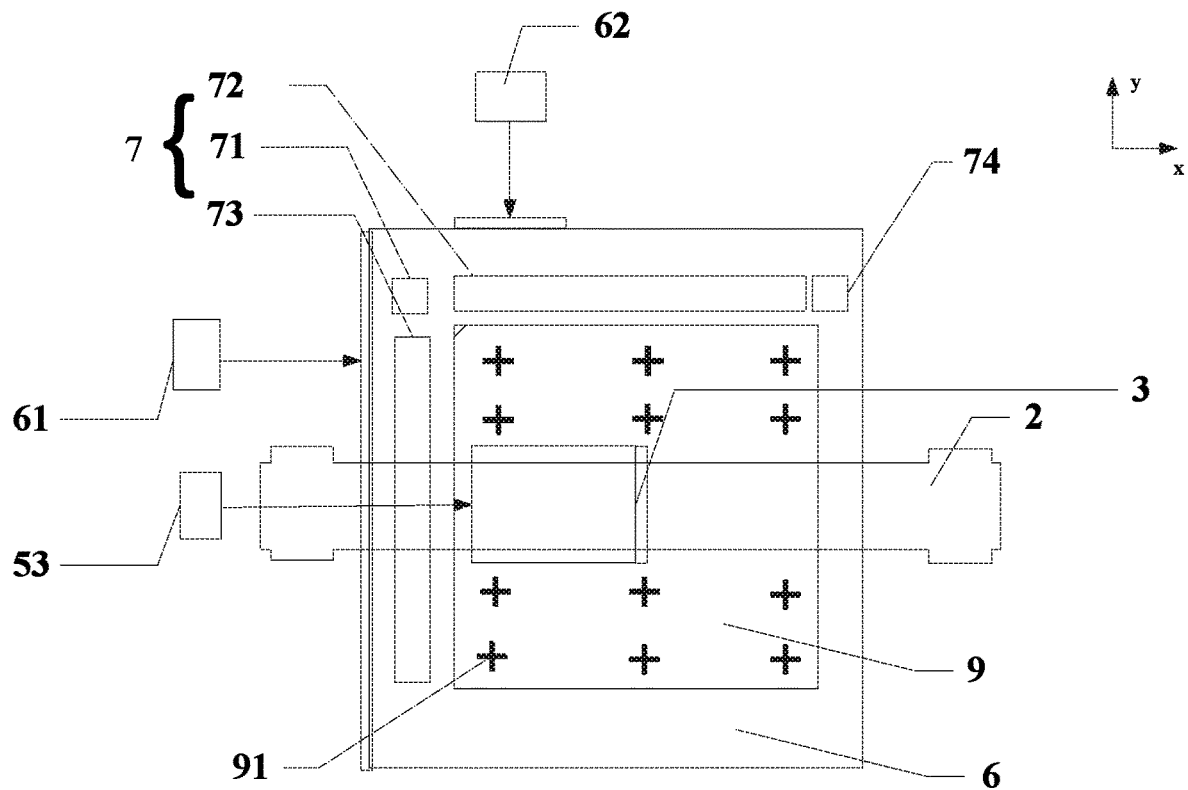
FIG. 2 is a top view of FIG. 1.

Referring to FIG. 1 and FIG. 2, a horizontally rightward direction is defined as an X direction, a direction perpendicular to the X direction within the horizontal plane is defined as a Y direction, and a vertically upward direction is defined as a Z direction, to establish a three-dimensional coordinate system in X, Y, Z directions. It should be noted that, FIG. 1 is merely a schematic diagram for showing components of an optical measurement device of the present invention. Positions of these components in the figure, especially mounting positions marked by dashed lines, are shown merely for reference, but do not indicate accurate mounting positions of the components.

As shown in FIG. 1 and FIG. 2, the optical measurement device provided by the present invention includes a support base 1 for bearing the whole optical measurement device. The support base 1 is formed by the following parts from bottom to top: foundation in contact with the ground, a vibration damper for mitigating an effect of ground vibration on measurement carried out by the device, and a marble platform on which X-direction and Y-direction drive mechanisms can be disposed.

Referring to FIG. 2, the support base 1 is a square platform, and a substrate carrier 6 is placed at the center of the support base. The substrate carrier 6 is mainly used to carry a substrate 9, and various kinds of reference boards 7 for calibration of the substrate 9 are placed around the substrate 9. The reference boards 7 include an X-direction reference board 72 for calibrating the substrate 9 in the X direction, a Y-direction reference board 73 for calibrating the substrate 9 in the Y direction, a line width calibration reference board 71; and a photoresist thickness calibration reference board 74 for calibrating the thickness of photoresist. The X-direction reference board 72 and the Y-direction reference board 73 are perpendicular to each other. The line width calibration reference board 71 and the photoresist thickness calibration reference board 74 are located at two ends of the X-direction reference board 72, respectively.

Periodically distributed alignment marks are designed and provided on both the X-direction reference board 72 and the Y-direction reference board 73, and are used to correct a positional deviation. The line width calibration reference board 71 is used to calibrate a deviation in measurement of critical dimension by using a first sensor 5b for precise position and line width measurement and a second sensor 5c for precise position and line width measurement, to ensure measurement accuracy of the critical dimension.

Above the support base 1, an optical detection platform frame 2 is disposed above the substrate carrier 6. The optical detection platform frame 2 is a gantry, which extends upwards from one side of the substrate carrier 6 along the Z direction to a certain height, extends along the X direction to the opposite side of the substrate carrier 6, and then extends downwards along the Z direction to the support base 1.

The optical detection platform frame 2 is shaped like a bridge, and includes two support uprights and a beam fixed on the two support uprights.

An optical detection slider 3 which can move along the optical detection platform frame 2 is disposed on the optical detection platform frame 2. That is to say, the optical detection slider 3 is mounted on the optical detection platform frame 2 and can move along the X direction. An optical detection device, namely, an optical detection module 5, is attached below the optical detection slider 3. A mark position measurement module, a line width measurement module, and a photoresist thickness measurement module are disposed beneath the optical detection module 5. The foregoing measurement modules are integrated in one optical detection module 5. When the optical detection module 5 is driven by the optical detection slider 3 to move along the X direction, any combination of the foregoing measurement modules can be selected for measurement, or they can be separately used for measurement. During measurement of data regarding the substrate 9, the foregoing modules simultaneously correspond to the same position, thus facilitating analysis, and especially facilitating analysis of a correlation between the critical dimension (for example, the line width) of a line and the photoresist thickness.

A height adjustment device is disposed on the optical detection module 5, and is mounted on a vertical motion mechanism control unit 4 at one side of the optical detection module 5. The height adjustment device can control Z-direction motion of the optical detection module 5 with respect to the optical detection slider 3, thus adjusting the height of the optical detection module 5 with respect to the substrate 9.

Specifically, continuously referring to FIG. 1, the mark position measurement module, the line width measurement module, and the photoresist thickness measurement module on the lower surface of the optical detection module 5 are set as follows:

a rough position measurement sensor 5a, used for measuring a deviation of the substrate 9 from the substrate carrier 6, so as to ensure that substrate marks 91 on the substrate 9 fall within fields of view defined by the first sensor 5b for precise position and line width measurement and the second sensor 5c for precise position and line width measurement;

the first sensor 5b for precise position and line width measurement, used for measuring positional deviations of the substrate marks 91, a line width up to the critical dimension of a photoresist line, and overlay deviations;

the second sensor 5c for precise position and line width measurement, used for measuring positional deviations of the substrate marks 91, a line width up to the critical dimension of the photoresist line, and overlay deviations. The second sensor 5c for precise position and line width measurement and the first sensor 5b for precise position and line width measurement are symmetrically arranged. The second sensor 5c for precise position and line width measurement has a smaller field of view compared to the first sensor 5b for precise position and line width measurement, such that a line width up to the critical dimension of a finer photoresist line can be measured;

a photoresist thickness measurement sensor 5d, used for measuring the thickness of photoresist on the substrate 9, or on the reference board 7, or on a silicon wafer, where this sensor and the rough position measurement sensor 5a are symmetrically arranged; and a first height measurement sensor 5e and a second height measurement sensor 5f, both used for measuring the height of the upper surface of the substrate 9, and symmetrically disposed on the first sensor 5b for precise position and line width measurement and the second sensor 5c for precise position and line width measurement respectively at the ends near the substrate 9.

The optical measurement device also includes: a first position measurement device for measuring the position of the substrate carrier 6; and a correction module for correcting mark positions measured by the mark position measurement module based on measurement information of the first position measurement device and a second position measurement device. The first position measurement device includes:

an X-direction interferometer control and measurement system 61 for the substrate carrier, used for controlling motion of the substrate carrier 6 in the X direction, and measuring the position of the substrate carrier 6 in the X direction and magnitude Rzx_ws of rotation of the substrate carrier 6 in an XZ plane, where the measured position is recorded as X_ws; and a Y-direction interferometer control and measurement system 62 for the substrate carrier, used for controlling motion of the substrate carrier 6 in the Y direction, and measuring magnitude Rzy_ws of rotation of the substrate carrier 6 in a YZ plane and an inclination Rx_ws thereof towards the X direction.

The X-direction interferometer control and measurement system 61 for the substrate carrier and the Y-direction interferometer control and measurement system 62 for the substrate carrier are respectively disposed on the X direction and the Y direction with respect to the substrate carrier 6.

The optical measurement device further includes a second position measurement device for measuring the position of the optical detection device, that is, for measuring the position and a positional deviation of the optical detection module 5. The second position measurement device is connected between the optical detection module 5 and the optical detection slider 3, and includes:

a module X-direction interferometer control and measurement system 51 which is disposed on the optical detection module 5 and includes a first sensor for measuring a displacement X_om of the optical detection module 5 in the X direction and a controller for controlling motion of the optical detection module 5 in the X direction, where the module X-direction interferometer control and measurement system 51 and a slider X-direction interferometer control and measurement system 52 are connected to each other, and by parameter processing on data measured by the two systems, an inclination Ry_om of the optical detection module 5 towards the Y direction can be obtained;

the slider X-direction interferometer control and measurement system 52 which is disposed on the optical detection slider 3 and includes a second sensor used for measuring magnitude Rzx_om of rotation of the optical detection module 5 in the XZ plane; and a module Y-direction interferometer control and measurement system 53, disposed on the optical detection module 5, and used for measuring a displacement Y_om of the optical detection module 5 with respect to the optical detection platform frame 2 and an inclination Rx_om of the optical detection module towards the X direction, where a measurement sensor able to carry out measurement in a short distance at high precision, such as an interferometer measurement system, is used as the module Y-direction interferometer control and measurement system 53; or a laser triangle ruler or a laser displacement sensor is selected.

In the present invention, a substrate temperature control unit 8 is further provided on the substrate carrier 6, which is a constant temperature system and disposed beneath the substrate 9. When the substrate 9 is mounted on the substrate carrier 6, the substrate temperature control unit can make the substrate 9 reach a target temperature rapidly, thus shortening the waiting time of the substrate 9 to reach the target temperature before a test, and improving production efficiency.

Moreover, in the optical measurement device of the present invention, the data detection modules or units or systems in the above description are all connected to a parameter processing unit in a control system. The parameter processing unit processes the detected data, and feeds back results to corresponding position control systems after completion of the processing. For example, the parameter processing unit feeds back the results to the vertical motion mechanism control unit 4, the module X-direction interferometer control and measurement system 51, the slider X-direction interferometer control and measurement system 52, the X-direction interferometer control and measurement system 61 for the substrate carrier, and the Y-direction interferometer control and measurement system 62 for the substrate carrier, to control respectively corresponding parts to make corresponding movement.

In the present invention, since the optical detection platform frame 2 deforms during operation, the optical detection slider 3 is likely to have a movement deviation in each of the X, Y, and Z directions during movement. To avoid occurrence of this situation and compensate for these movement deviations, the optical measurement device also includes a deformation measurement device located on the optical detection platform frame 2 and used for measuring magnitude of deformation of the optical detection platform frame. The deformation measurement device includes two first interferometer measuring components disposed along the beam direction, which are specifically frame Y-direction interferometer measurement systems 21 and 22 symmetrical about the substrate carrier 6. When the substrate carrier 6 moves along the Y direction, the frame Y-direction interferometer measurement systems 21 and 22 can measure magnitude Yref of deformation of the optical detection platform frame 2 in the Y direction and magnitude Rzref of rotational deformation thereof about the Z axis. The X-direction interferometer control and measurement system 61 for the substrate carrier and the Y-direction interferometer control and measurement system 62 for the substrate carrier correct and align the position of the substrate carrier 6 according to the measured data.

The two first interferometer measuring components and two second interferometer measuring components are arranged at the same level.

The present invention also provides a measurement method using the foregoing measurement device. The frame Y-direction interferometer measurement systems 21 and 22 are used to measure magnitude of deformation of the optical detection platform frame 2; and the X-direction interferometer control and measurement system 61 for the substrate carrier and the Y-direction interferometer control and measurement system 62 for the substrate carrier correct the position of the substrate carrier 6 in real time according to the measured position of the substrate carrier 6 and the magnitude of deformation of the optical detection platform frame 2. The method specifically includes the following steps:

Step 1: Referring to FIG. 2, a substrate 9 having substrate marks 91 is provided, and is placed on the substrate carrier 6. The substrate carrier 6 moves along the Y direction by Yi (that is, a displacement along the Y direction is Yi), and the optical detection module 5 moves along the X direction by Xi (that is, a displacement along the X direction is Xi), such that any mark i is located below the optical detection device.

Step 2: The frame Y-direction interferometer measurement systems 21 and 22 measure magnitude Yi_ref of deformation of the optical detection platform frame 2 in the Y direction and magnitude Rzi_ref of rotational deformation thereof about the Z axis. Yi_ref=(Y1_ref+Y2_ref)/2; and Rzi_ref=(Y1_ref−Y2_ref)/IFdx_ref, where IFdx_ref is an interval between the frame Y-direction interferometer measurement systems 21 and 22 in the X direction; and Y1_ref and Y2_ref are magnitude of deformation of the optical detection platform frame 2 in the Y direction, respectively measured by the frame Y-direction interferometer measurement systems 21 and 22.

Step 3: The parameter processing unit calculates a correction for an actual position: Delt_Yi=−(Yi_ref+Rzi_ref×Xi).

Step 4: The parameter processing unit feeds back the correction Delt_Yi for the actual position to the correction module. The correction module transmits the data to the X-direction interferometer control and measurement system 61 for the substrate carrier and the Y-direction interferometer control and measurement system 62 for the substrate carrier. The two systems 61 and 62 separately control the motion of the substrate carrier 6 in the X direction and the Y direction, to correct the position of the substrate carrier 6, such that the optical detection device is aligned with the detection marks i.

For measurement of any position on the substrate 9, steps 1 to 4 can be performed for compensation.

Embodiment 2

The difference between this embodiment and Embodiment 1 is described as follows. At least one of the frame Y-direction interferometer measurement systems 21 and 22 is a biaxial interferometer or a monoaxial interferometer. The biaxial interferometer emits two measurement light beams which are parallelly distributed along the Z direction, to measure magnitude Rxi_ref of inclined deformation of the optical detection platform frame about the X axis. The deformation measurement device further includes a frame X-direction interferometer measurement system (not shown in the figure), which is used for measuring magnitude Xi_ref of deformation of the optical detection platform frame 2 in the X direction and magnitude Ryi_ref of inclined deformation thereof about the Y axis. The module X-direction interferometer control and measurement system 51 corrects and aligns the position of the optical detection module 5 according to the magnitude Xi_ref of deformation of the optical detection platform frame 2 in the X direction, the magnitude Ryi_ref of inclined deformation about the Y axis, and the magnitude Rxi_ref of inclined deformation about the X axis, to implement a correction function.

The embodiments of the present invention have been described above, but the present invention is not limited to the embodiments. Apparently, persons skilled in the art can make various modifications and variations to the present invention without departing from the spirit and scope of the present invention. Thus, if such modifications and variations to the present invention fall within the scope of the appended claims and the equivalent technique, the present invention is also intended to include such modifications and variations.

What is claimed is:

1. An optical measurement device, comprising:
a substrate carrier, configured to carry a substrate;
an optical detection platform frame, configured to bear and support an optical detection slider above the substrate carrier, the optical detection slider being able to slide along the optical detection platform frame;
an optical detection device, attached to the optical detection slider, and able to move along the optical detection platform frame with the optical detection slider;
a first position measurement device, configured to measure a position of the substrate carrier; and
a second position measurement device, configured to measure a position of the optical detection device,
wherein the optical measurement device further comprises: a deformation measurement device for measuring a magnitude of deformation of the optical detection platform frame, and wherein the position of the substrate carrier and/or the position of the optical detection device is corrected according to the magnitude of deformation of the optical detection platform frame;
the deformation measurement device comprises two first interferometers arranged in parallel with a slide direction of the optical detection slider;
the first position measurement device comprises two second interferometers, which are parallel with and perpendicular to the slide direction of the optical detection slider, respectively;
the second position measurement device comprises two third interferometers, which are respectively disposed on the optical detection device and the optical detection slider to measure a displacement of the optical detection device and to measure magnitude of rotation of the optical detection device.

2. The optical measurement device according to claim 1, wherein the optical detection platform frame is of a bridge type and comprises two support uprights and a beam fixed on the two support uprights; and the optical detection slider is able to slide on the beam.

3. The optical measurement device according to claim 2, wherein the two first interferometers are in one-to-one positional correspondence with the two support uprights and emit measurement light beams onto the two support uprights.

4. The optical measurement device according to claim 3, wherein the two second interferometers emit measurement light beams onto the substrate carrier.

5. The optical measurement device according to claim 4, wherein the two first interferometers and the two second interferometers are arranged at a same level.

6. The optical measurement device according to claim 3, wherein at least one of the two first interferometers is a biaxial interferometer, and two measurement light beams emitted by the biaxial interferometer are parallelly distributed along an extension direction of the two support uprights.

7. The optical measurement device according to claim 2, wherein the deformation measurement device further comprises a fourth interferometer perpendicular to each of the slide direction of the optical detection slider and an extension direction of the two support uprights, and the third interferometer emits a measurement light beam onto the optical detection platform frame along the slide direction of the optical detection slider.

8. The optical measurement device according to claim 7, wherein the fourth interferometer is a monoaxial interferometer.

9. The optical measurement device according to claim 7, wherein the fourth interferometer is a biaxial interferometer.

10. The optical measurement device according to claim 1, further comprising a support base for carrying the substrate carrier and the optical detection platform frame.

11. The optical measurement device according to claim 1, wherein the support base comprises a vibration damper and a marble platform from bottom to top.

12. The optical measurement device according to claim 1, wherein the optical detection device is used for detecting one or more of a line width of a pattern formed on the substrate after exposure, an overlay deviation, a mark position deviation, and a photoresist thickness.

13. A measurement method using the optical measurement device according to claim 1, wherein a direction in which the optical detection slider moves along the optical detection platform frame is defined as an X direction, a direction perpendicular to the X direction within a horizontal plane is defined as a Y direction, and a vertical direction is defined as a Z direction, to establish a three-dimensional coordinate system in the X, Y, Z directions; and the method comprises the following steps:

providing the substrate having detection marks and placing the substrate on the substrate carrier;

controlling the substrate carrier to move along the Y direction by a distance of Yi, and controlling the optical detection device to move along the X direction by a distance of Xi, such that a detection mark i is located below the optical detection device; and measuring, by the deformation measurement device, the magnitude of deformation of the optical detection platform frame; and correcting the position of the substrate carrier and/or the position of the optical detection device according to the magnitude of deformation of the optical detection platform frame, and calculating a position of the detection mark i according to the corrected position of the substrate carrier and/or the corrected position of the optical detection device, such that the optical detection device is aligned with the detection mark i.

14. The measurement method according to claim 13, wherein correcting the position of the substrate carrier according to the magnitude of deformation of the optical detection platform frame comprises:

emitting at least two first measurement light beams parallel with the Y direction onto two support uprights of the optical detection platform frame; when the substrate carrier moves in the Y direction, measuring magnitudes Y1_ref and Y2_ref of deformations of the two support uprights in the Y direction, to obtain a magnitude Yi_ref of deformation of the optical detection platform frame in the Y direction as Yi_ref=(Y1_ref+Y2_ref)/2 and a magnitude Rzi_ref of rotational deformation of the substrate carrier about a Z axis as Rzi_ref=(Y1_ref−Y2_ref)/IFdx_ref, wherein IFdx_ref is a distance between the two first measurement light beams in the X direction;

calculating a correction Delt_Yi for the position of the substrate carrier as Delt_Yi=−(Yi_ref+Rzi_ref*Xi); and feeding back the correction Delt_Yi to correct the position of the substrate carrier in the Y direction.

15. The measurement method according to claim 13, wherein correcting the position of the optical detection device according to the magnitude of deformation of the optical detection platform frame comprises:

emitting a second measurement light beam parallel with the X direction onto the optical detection platform frame; and when the optical detection device moves along the X direction, measuring a magnitude Xi_ref of deformation of the optical detection platform frame in the X direction and a magnitude Ryi_ref of inclined deformation thereof about a Y axis;

simultaneously emitting two third measurement light beams parallel with the Y direction onto the optical detection platform frame; and measuring a magnitude Rxi_ref of inclined deformation of the optical detection platform frame about an X axis, wherein the two third measurement light beams are parallel along the Z direction; and correcting the position of the optical detection device in the X direction according to the magnitude Xi_ref of deformation of the optical detection platform frame in the X direction, the magnitude Ryi_ref of inclined deformation about the Y axis, and the magnitude Rxi_ref of inclined deformation about the X axis.

* * * * *